(12) United States Patent
Draxelmayr (10) Patent No.: US 7,352,309 B2
(45) Date of Patent: Apr. 1, 2008

(54) CIRCUIT ARRANGEMENT FOR GENERATING SWITCH-ON SIGNALS

(75) Inventor: Dieter Draxelmayr, Villach (AT)

(73) Assignee: Infineon Technologies AG, Munich (DE)

( * ) Notice: Subject to any disclaimer, the term of this patent is extended or adjusted under 35 U.S.C. 154(b) by 43 days.

(21) Appl. No.: 11/392,351

(22) Filed: Mar. 29, 2006

(65) Prior Publication Data

US 2006/0220695 A1    Oct. 5, 2006

(30) Foreign Application Priority Data

Apr. 4, 2005    (DE)    ...................... 10 2005 015 429

(51) Int. Cl.
*H03M 1/00*    (2006.01)
(52) U.S. Cl. ...................................... 341/122
(58) Field of Classification Search ................ 341/141, 341/161, 159, 155, 124, 122
See application file for complete search history.

(56) References Cited

U.S. PATENT DOCUMENTS

| | | | | |
|---|---|---|---|---|
| 4,968,988 | A | * | 11/1990 | Miki et al. .................. 341/141 |
| 5,294,926 | A | | 3/1994 | Corcoran |
| 5,990,820 | A | * | 11/1999 | Tan ............................ 341/161 |
| 7,049,994 | B2 | * | 5/2006 | Tsujita ........................ 341/161 |
| 2001/0052864 | A1 | * | 12/2001 | Shimizu et al. ............. 341/141 |
| 2003/0151441 | A1 | | 8/2003 | Neff |

OTHER PUBLICATIONS

German Office Action dated Nov. 24, 2005.

* cited by examiner

*Primary Examiner*—Brian Young
(74) *Attorney, Agent, or Firm*—Jenkins, Wilson, Taylor & Hunt, P.A.

(57) ABSTRACT

A circuit arrangement for generating switch-on signals for driving track-and-hold elements of an analog-to-digital converter operating with interleaved timing comprises a first input for inputting a common reference clock signal, at least one window device for generating clock signals which are interleaved with respect to one another in terms of timing and whose respective time windows in which the respective of the clock signals has a first logic level are derived from the reference clock signal, and at least one gate device for generating a switch-on signal. The gate device is connected downstream of the window device and combines logically the reference clock signal with a respective of the clock signals and with a further information item so that a time window of the switch-on signal is at least longer than the window of the reference clock signal.

28 Claims, 5 Drawing Sheets

CIRCUIT ARRANGEMENT FOR GENERATING SWITCH-ON SIGNALS

BACKGROUND OF THE INVENTION

1. Field of the Invention

The invention relates to a circuit arrangement for generating the clock of an analog-to-digital converter which operates with interleaved timing, such an analog-to-digital converter and methods for operating the circuit arrangement.

2. Description of the Prior Art

A/D converters are primarily used in digital signal processing. Applications for digital signal processing are, for example, computer-based applications, for example in a microprocessor, or telecommunications applications, for example broadband applications or mobile radio applications. In particular in these applications there is the need for a high-bit-rate analog-to-digital conversion with a very high sampling rate and a correspondingly high level of precision of conversion. In particular for applications in which a very high-bit-rate conversion is necessary, what are referred to as A/D converters which operate with interleaved timing, which are frequently also referred to as converter array or time-interleaved A/D converters (TIADC), are frequently used. This type of A/D converter is referred to below for short as A/D converter.

For the general background of A/D converters which operate with interleaved timing in general and the clock-generating device and track-and-hold circuits thereof in particular, reference is made to U.S. Pat. No. 6,259,281 B1, European patent 1 044 505 B1, European patent 1 006 525 B1, published international patent application 2004/079917 A1 and the article in the conference volume ESSCIRC 2004 by Simon M. Louwsma et al., "A 1.6 GS/s, 16 times interleaved track & hold with 7.6 ENOB in 0.12 µm CMOS", pages 343-346.

An A/D converter which operates with interleaved timing is configured to convert an analog input signal into a digital output signal. For this purpose, the A/D converter has at least two individual A/D converters which are arranged in parallel with one another. These so-called individual A/D converters operate with interleaved timing and use a track-and-hold circuit which is assigned to this individual A/D converter to sample the analog input signal with interleaved timing. To do this, the track-and-hold circuits are each driven with an individual clock signal. A respective individual clock signal defines a time window within which the respective track-and-hold circuit is activated, that is to say switched on, and thus samples the analog input signal. In the simplest case, these individual clock signals are derived from a common clock signal and are modified in such a way that the respective time windows of the individual clock signals are formed with interleaved timing in their respective time sequence (timing). These individual clock signals with interleaved timing will be referred to as individual clock signals or switch-on signals below.

Precise timing and thus the generation of the individual clock signals are elementary in particular for high-speed applications since this essentially characterizes the speed and thus the efficiency of the entire A/D converter. Particular attention is paid to the fact that the individual clock signals have edges which are as steep as possible in order to permit the respective track-and-hold circuit which is currently being driven by means of such an individual clock signal to sample a sufficiently wide time window and make it possible to drive the analog input signal.

In the genus-forming U.S. Pat. No. 6,259,281 B1 which is mentioned at the beginning, this is achieved by a clock signal generator which is specially provided for this, said clock signal generator having the purpose of generating sub-sampling signals with a relatively high clock edge speed and correctly timed clock edges. The clock signal generator which is known from U.S. Pat. No. 6,259,281 B1 and the corresponding timing of the individual clock signals are briefly described below with reference to FIGS. 1a and 1b.

Figure 1A:
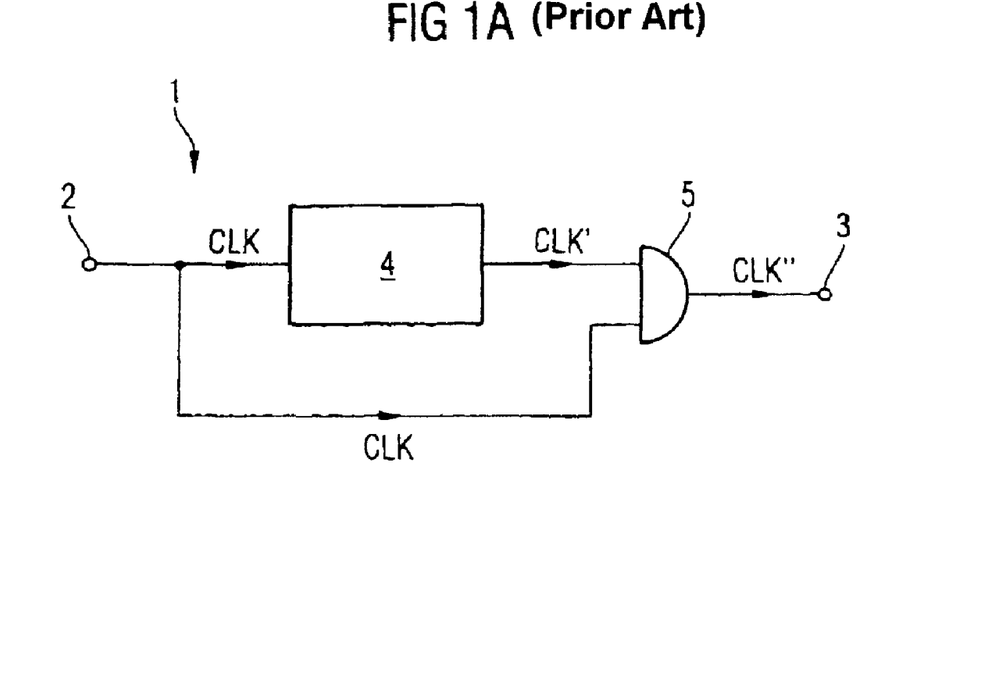
Figure 1B:
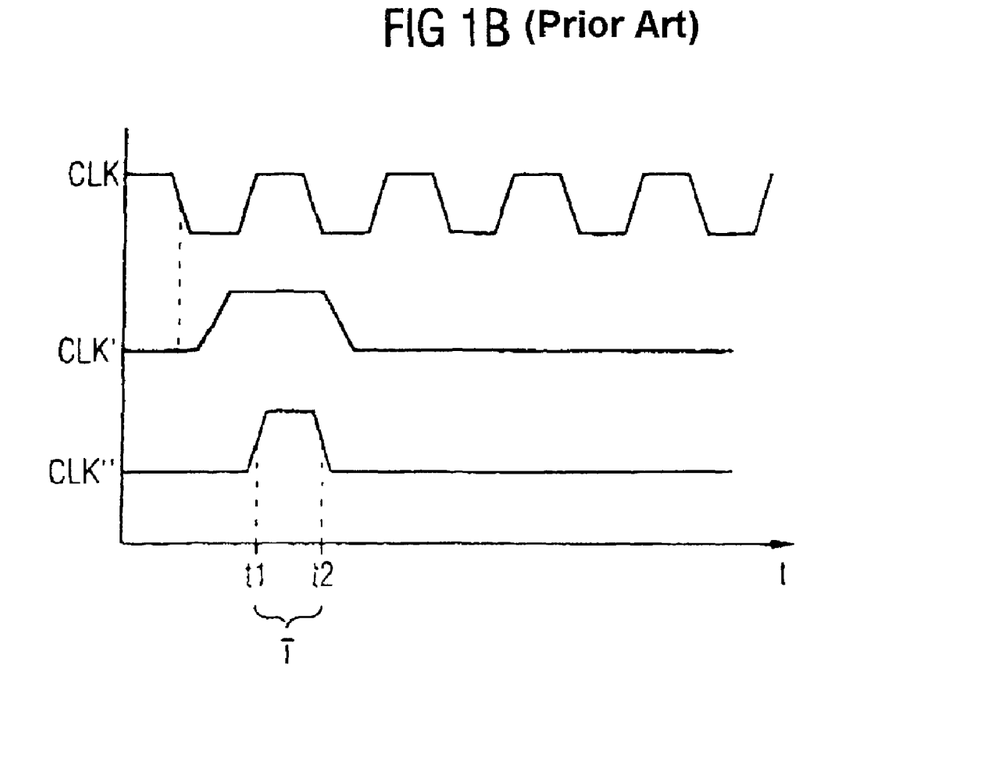

The clock signal generator which is designated by the reference 1 has a clock input 2 for inputting a common clock signal CLK and a clock output 3 at which individual clock signals CLK" which have interleaved timing with respect to one another can be tapped. A window device 4 which is configured to generate a plurality of individual clock signals CLK' with interleaved timing with respect to one another from the common clock signal CLK (master clock), only one of said individual clock signals CLK' being shown in FIGS. 1a and 1b, is provided between clock input 2 and clock output 3 for generating the individual clock signals CLK". The window device 4 has a plurality of AND gates (only one of which is illustrated in FIG. 1a) connected downstream of it, to each of which one of the clock signals CLK' with interleaved timing and the common clock signal CLK are fed. The individual clock signals CLK" which have interleaved timing with respect to one another are generated by AND logic operations performed on these two clock signals CLK, CLK'. The individual clock signals CLK" which are generated in this way therefore simulate the common clock signal CLK, that is to say the period within which a respective individual clock signal CLK" has a high logic level corresponds to the period T=t2−t1 of a half-clock of the common clock signal CLK.

In this context there is the particular problem that a respective individual A/D converter is intended to perform the A/D conversion as precisely as possible, in particular on one LSB (=least significant bit) in a precise way. For this purpose, the analog input signal in the track-and-hold circuit is firstly loaded (tracked) into memory elements which are embodied, for example, as capacitors, which requires a time period corresponding to the capacitance of the storage capacitors. In particular at very high frequencies and when there is a time window with the duration T of, for example, half a clock of the common clock signal, as in U.S. Pat. No. 6,259,281 B1, there is thus a very short time period available within which the respective analog input signal has to be read into the memory elements and fed via the driver to the individual A/D converter which is respectively connected downstream. However, since the most unfavorable case (worst case) must always be taken into account, that is to say that the analog input signal to be converted requires the entire voltage excursion and as a result all the memory elements of the track-and-hold circuit have to be loaded, the available time window is frequently not sufficient for an A/D converter which is configured for high-speed application. This leads overall to a reduction in the speed of the A/D conversion and thus in the efficiency of the A/D converter. In order nevertheless to ensure a high level of efficiency and thus a high speed of the A/D conversion, the track-and-hold circuit would have to be activated as quickly as possible after the switching-on process in order to load all the memory elements within the time window, but this makes very large demands on the corresponding track-and-hold circuit in terms of circuit technology.

A further problem arises when a defined switch-on edge, with which the track-and-hold circuit is to be switched on, is generated. The switching-off edge of the individual clock signal, at which therefore the track-and-hold circuit is switched off, can typically be set in a relatively precise way. However, generating a defined switch-on edge—with which the track-and-hold circuit is to be switched on—which can fluctuate to a greater or lesser degree is problematic. An undefined, fluctuating switch-on edge can be responsible for the time window for switching on the track-and-hold circuit not being defined and varying over a relatively large range. This is a state which is not desirable in particular for high-frequency applications in which very short time windows are available.

SUMMARY OF THE INVENTION

It is an object of the present invention to provide an improved clock signal generator which permits in particular improved driving of a track-and-hold circuit or an individual A/D converter. A further object is to provide an A/D converter which operates with interleaved timing and has simplified clock signal generation and in particular improved efficiency.

The object is achieved in accordance with the invention by means of a circuit arrangement for generating switch-on signals for driving track-and-hold elements of an analog-to-digital converter which operates with interleaved timing, comprising: a first input for inputting a common reference clock signal, at least one window device for generating clock signals which are interleaved with respect to one another in terms of timing and whose respective time windows in which the respective clock signal has a first logic level are derived from the reference clock signal, at least one gate device which is connected downstream of the window device and has the purpose of generating a switch-on signal which logically combines the reference clock signal with a respective clock signal, with interleaved timing, and a further information item in such a way that the time window of the switch-on signal is at least longer than the time window of the reference clock signal.

The object is also achieved in accordance with the invention by means of an analog-to-digital converter which operates with interleaved timing, comprising: a signal input for inputting an analog input signal, a signal output for tapping a digital output signal which is derived from the analog input signal by A/D conversion, at least two converter paths which are arranged in parallel with one another and between the signal input and the signal output, at least one element of a respective converter path being respectively driven by an assigned switch-on signal, and the switch-on signals having a predetermined time interleaf with respect to one another, a circuit arrangement according to one of the preceding claims for generating switch-on signals for driving the converter paths.

The realization on which the present invention is based is that the track-and-hold circuit of A/D converters which operate with interleaved timing or corresponding circuits with a similar functionality does in fact not need to be active precisely for the period which is predefined by a respective individual clock signal and/or the reference clock signal. Instead, the respective track-and-hold circuit can also be switched on for a relatively long period in relation to the individual clock signal or the reference clock signal with interleaved timing provided that the functionality of the other track-and-hold circuits or of the corresponding individual A/D converters is not adversely affected by this.

Switched on means in this context that the corresponding track-and-hold circuit is in what is referred to as the tracking operating mode and reads in the respective analog input signal or a part thereof. Subsequently, the track-and-hold circuit is switched off and is in what is referred to as the hold operating mode in which the read-in information of the analog input signal is sampled and fed to the respective individual A/D converter for A/D conversion.

The idea of the present invention is in particular to at least lengthen the duration of the respective individual clock signals or switch-on signals which are derived from the common clock signal (reference clock signal) in order to drive a track-and-hold device which is connected downstream, and in particular to extend them for the period which is necessary to read in the analog input signal. For this purpose, the individual A/D converter preferably generates a status signal which indicates whether the sampled input signal is currently still required or whether a new value can already be read into the track-and-hold circuit.

This consequently provides the track-and-hold circuit with a longer time for inputting and reading in (tracking) the analog input signal and for respectively amplifying this signal. The entire process of A/D conversion is thus less critical overall in terms of time since the track-and-hold circuit is then provided with a correspondingly longer period for, for example, itself switching its driver components to the standby state and satisfactorily reading in the analog input signal in the available time, sampling them and passing them on to the respective individual A/D converter.

The present invention permits the track-and-hold process to extend for as long as necessary, which can in particular also mean that the switch-on signal which is derived from the clock signal generator according to the invention for switching on the track-and-hold circuit (for the tracking mode) can also be active for the duration of a plurality of clock cycles of the common reference clock signal. Active means in this sense that the signal has a changed logic level compared to an inactive state, as a result of which the corresponding track-and-hold device which is driven by it is activated, i.e. switched on.

The core of the present invention thus consists in the fact that in an A/D converter which operates with interleaved timing, sampling times for its individual A/D converter are acquired which are defined with the precision of the common clock signal but which nevertheless have a sampling period which is at least longer than the duration of a reference which is defined by the common clock signal, for example longer than half a clock cycle of the common clock signal in the case of a symmetrical clock signal of a reference.

A further aspect of the present invention which may also be advantageous is that the provision of a switch-on signal which is extended in its period allows the respective track-and-hold circuit to be configured in a significantly simpler way in terms of circuit technology since here lesser demands in terms of circuit technology can be made on the track-and-hold circuit, in particular with respect to its driving and amplification.

The additional information item may be a status information item about the instantaneous status of the conversion of the individual A/D converter which is assigned to the corresponding track-and-hold element.

At least one second input may be provided, into which a status signal which contains the status information about the state of the respective current A/D conversion can be input.

Typically, but not necessarily, the circuit arrangement may be embodied as a clock generator and has a first input, embodied as a clock input, for inputting a common clock signal, and which has a plurality of outputs at which the switch-on signals can be tapped.

The window device may be embodied as a DLL (= delay locked loop) circuit or may have a DLL circuit.

The number of gate devices may correspond to the number of clock signals and/or switch-on signals which are generated by the window device and have interleaved timing with respect to one another.

At least one of the gate devices may preferably be embodied as a flip-flop, in particular as an RS flip-flop. In this context, a gate device can preferably have a plurality of logic gates which are, for example, logically combined as follows: at least a first and a second NOR gate are provided whose gate outputs and whose first gate inputs are connected to one another in crisscross fashion, and the second gate input of the second NOR gate is connected to the second input. In addition, at least a first AND gate is provided which is connected at the output end to the second gate input of the first NOR gate and which is connected at the input end to the window device and to the first input.

At least one gate device may have a third input, into which a synchronous, further clock signal with interleaved timing which is derived from the clock signal with interleaved timing can be input. The further clock signal occurs before the clock signal with interleaved timing, the gate device also takes into account the further status signal in the generation of the switch-on signal. Such a gate device may preferably have a second AND gate which is connected at the input end to the second and third input and at the output end to the second gate input of the second NOR gate.

A respective gate device may have at least one combi gate. A combi gate is to be understood as being a logic gate which combines the functionality of a plurality of gates, for example the abovementioned NOR and AND gates or additionally or alternatively also other gate types. Combi gates are to be preferred in particular for their gate transit times compared to a collection of a plurality of separate gates with the same function with which the entire gate transit time is typically a product of the sum of the individual gate transit times which are assigned to each gate. As a result, combi gates are particularly well suited in particular for high-speed applications.

With respect to the invention, the time window of the switch-on signal designates the time period in which the analog input signal is read into the respective track-and-hold element. This process of reading in is also referred to as tracking and constitutes the time-critical parameter in an analog-to-digital converter which is to be configured in particular for very high speeds. The time window of the reference clock signal, which usually refers to the master clock, preferably corresponds to the duration of a half-clock of the reference clock signal.

Typically, but not necessarily, the reference clock signal may designate the master clock or the system clock of the circuit arrangement or of an analog-to-digital converter which is assigned to the circuit arrangement. However, it would also be conceivable for the reference clock signal to be generated by a different device or in some other way, for example by means of a clock-generating device which is specially provided for this purpose in the circuit arrangement or in the analog-to-digital converter which is assigned to the circuit arrangement.

In a restricted version of the inventive A/D converter, in each case a converter path has at least one individual A/D converter and a track-and-hold circuit which is connected upstream of this individual A/D converter and can be activated by a respective switch-on signal and which then picks up the analog input signal which is present at the signal input and passes it on to the respectively assigned individual A/D converter in order to generate a digital intermediate signal.

A logic circuit, typically embodied as a logic circuit, in particular one or more multiplexers, may be provided, which connects together the digital intermediate signals acquired from the plurality of converter paths in order to generate the digital output signal. It would also be conceivable for the digital intermediate signals which are generated by the respective individual A/D converters not to be combined to form a single digital signal in the logic operation circuit but rather to be combined only partially, for example into a plurality of digital signal paths. This is advantageous in particular for very fast A/D converters which, for example, have a relatively slow circuit component connected downstream of them.

Typically, but not necessarily, a respective track-and-hold circuit within the corresponding converter path may be an integral component of the respectively assigned converter path of this individual A/D converter. All or at least a number of the track-and-hold circuits and individual A/D converters are preferably integrated in a single semiconductor chip and thus in the A/D converter which operates with interleaved timing.

The individual A/D converters may be embodied as A/D converters according to the principle of successive approximation. The particular advantage here is that this type of an A/D converter successively converts the individual bits. This has the advantage that with the last bit of the individual A/D converter it is possible, as it were, to set a status signal which actually indicates that the conversion is terminated. In this way it is not necessary to make available a device which is complex in terms of circuitry and which has to generate this status signal.

A restricted version of the inventive method provides for the status signal to be set to a first logic level for the period during which the respective conversion is active, and to be otherwise set to a second logic level. A method according to the invention which is also preferred provides for the status signal to briefly change its logic level, preferably in the shape of a pulse, every time the conversion ends.

In a further restricted version of the inventive method, the switch-on signal is set, at maximum for the duration of the reading-in of the analog input signal, to a first logic level for activating the respectively assigned track-and-hold circuit. The time window in which the switch-on signal has a first logic level defines here the time period during which the corresponding track-and-hold circuit reads in the analog input signal, the track-and-hold circuit being switched on when there is a signal change from a second logic level to the first logic level, and being switched off when there is a signal change from the first logic level to the second logic level.

DESCRIPTION OF THE DRAWINGS

FIG. 1 is a block circuit diagram of a clock generator (a) which is known from U.S. Pat. No. 6,259,281 B1, and shows the corresponding timing of the clock signals (b).

FIG. 3 is a circuit diagram of a first exemplary embodiment of a gate device for a clock generator (a) such as is illustrated, for example in FIG. 2, and shows the associated timing of the signals (b).

FIG. 4 is a circuit diagram of a second exemplary embodiment of a gate device for a clock generator (a) and shows the associated timing of the signals (b and c).

DESCRIPTION OF THE PREFERRED EMBODIMENTS

Identical and functionally identical elements, features and signals in the figures of the drawings have been, unless indicated otherwise, provided with the same reference symbols.

Figure 2:
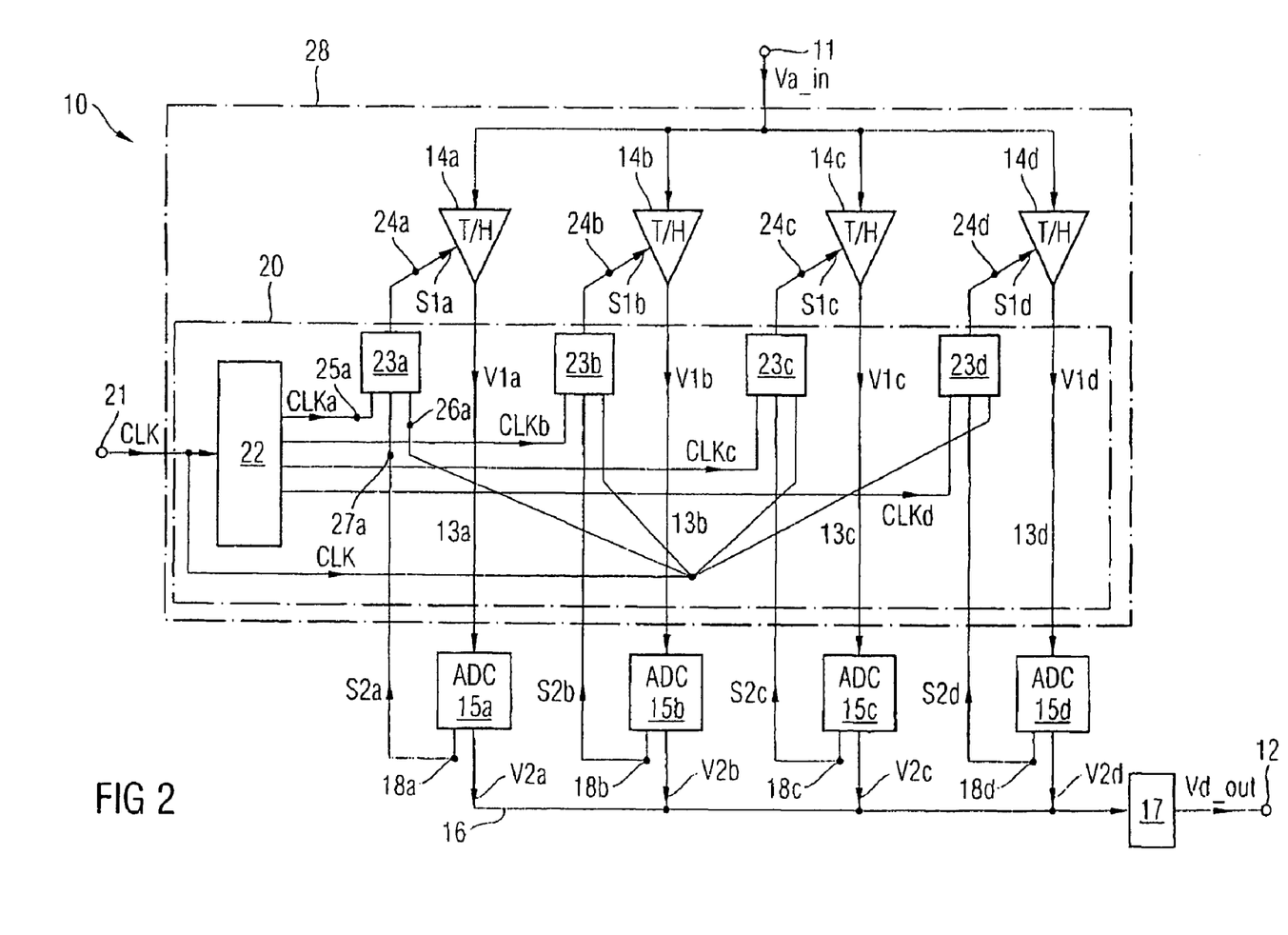
FIG. 2 is a block circuit diagram of an inventive A/D converter which operates with interleaved timing.

FIG. 2 shows a block circuit diagram of an A/D converter according to the invention which operates with interleaved timing. In FIG. 2, the A/D converter according to the invention which operates with interleaved timing is designated by the reference symbol 10. The A/D converter 10 has an input 11 for inputting an analog input signal Va_in and an output 12 at which a digital output signal Vd_out can be tapped. In the present exemplary embodiment, the A/D converter 10 has a total of four converter paths 13a-13d. The respective converter paths 13a-13d are arranged in parallel with one another and each contain a track-and-hold circuit 14a-14d and an individual A/D converter 15a-15d which is connected downstream of the respective track-and-hold circuit 14a-14d.

The design and the method of operation of such an A/D converter 10 which is illustrated in FIG. 2 and contains four converter paths 13a-13d is described in detail in U.S. Pat. No. 6,259,281 B1 which is described at the beginning. The entire contents of U.S. Pat. No. 6,259,281 B1 are herewith incorporated into the present patent application in terms of the arrangement of the converter paths 13a-13d arranged between the input 11 and output 12 of the A/D converter 10 and in particular in terms of the track-and-hold circuits 14a-14d and individual A/D converters 15a-15d contained therein.

The letters a-d respectively characterize below the respective converter path and the devices or signals which are arranged in the respective converter path or assigned to it.

The individual A/D converters 15a-15d are connected at the output end to a common databus 16 to which the digital intermediate signals V2a-V2d of the individual A/D converters 15a-15d are thus fed. The databus 16 is connected to a logic device 17, which contains, for example, a multiplexer in which the digital intermediate signals V2a-V2d which are generated by the individual A/D converters 15a-15b are combined. From these, the logic device 17 generates at the output end the digital signal Vd_out which is provided at the output 12.

A respective individual A/D converter 15a-15d is also configured to generate a control signal or a status signal S2a-S2d which indicates the instantaneous state of the A/D conversion in the respective individual A/D converter 15a-15d. These status signals S2a-S2d are provided at a respective control output 18a-18d of the individual A/D converter 15a-15d.

For the method of operation of the A/D converter 10 according to the invention, the track-and-hold circuits 14a-14d must be correspondingly driven with a clock signal in such a way that in each case the analog signal Va_in is successively fed with interleaved timing to one of the individual A/D converters 15a-15d. For this purpose, the A/D converter 10 has a clock generator 20 according to the invention. The clock generator 20 according to the invention is configured to generate in each case clock signals S1a-S1d with which the respective track-and-hold circuits 15a-15d are driven with interleaved timing in such a way that they are activated. The clock generator 20 thus has the functionality of a control device which generates control signals or switch-on signals S1a-S1d for switching on the track-and-hold circuits 14a-14d in the form of time-interleaved clock signals with time windows which have interleaved timing with respect to one another. The clock generator 20 thus functions as a switch-on and switch-off controller for the various track-and-hold circuits 14a-14d.

The clock generator 20 derives these switch-on signals S1a-S1d for switching on and thus activating the track-and-hold circuits 14a-14d from a common reference. For this purpose, the clock generator 20 has a clock input 21 via which a common clock signal CLK is input into the clock generator 20. The clock generator 20 also has a window device 22 which is connected at the input end to the clock input 21 and which generates at the output end a number (that is to say n=4) of clock signals CLKa-CLKd, having time windows with interleaved timing with respect to one another, which corresponds to the number of converter paths 13a-13d from the common clock signal CLK. The clock generator 20 according to the invention also has n=4 logic gate devices 23a-23d which, in the present exemplary embodiment, have at least three inputs and a control output 24a. The precise structure and the method of functioning of these gate devices 23a-23d within the clock generator 20 according to the invention is also described below in detail.

The gate devices 23a-23d are connected at the output end to a respective track-and-hold circuit 14a-14d via the control output 24a-24d and are designed to generate a corresponding switch-on control signal S1a-S1d for a respectively assigned track-and-hold circuit 14a-14d. For this purpose, the gate devices 23a-23d are each connected by a first input 25a-25d to the output of the window device 22. A second input 26a-26d is connected to the clock input 21 for inputting the common clock signal CLK. A third input 27a-27d is connected to the control output 18a-18d of the respective individual A/D converter 15a-15d for inputting the respective control signal S2a-S2d. The logic gate devices 23a-23d generate, from the signals CLKa-CLKd, CLK, S2a-S2d which are input via the inputs 25a-25d, 26a-26d, 27a-27d, the switch-on control signals S1a-S1d which are fed to the respective track-and-hold circuits 14a-14d.

The clock generator 20 and the track-and-hold circuits 14a-14d define a sampling device 28 which generates from the analog input signal Va_in in each case subsampled analog signals V1a-V1d which are fed to the respective individual A/D converter 15a-15d.

Figure 3A:
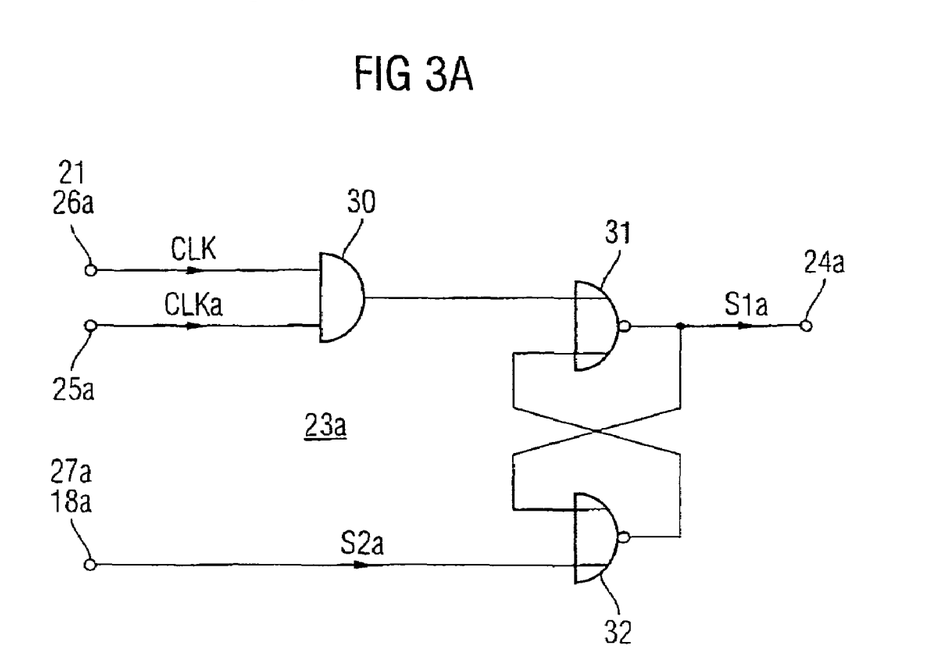

A first preferred exemplary embodiment of a gate device for a clock generator (a) such as is illustrated, for example, in FIG. 2 will now be described with reference to FIG. 3. It is assumed that the example in FIG. 3a concerns the gate device which is assigned to the first converter path 13a, which is indicated by the index "a" on the terminals and signals.

The gate device 23a contains a total of three logic individual gates, an AND gate 30 as well as two NOR gates 31, 32. The AND gate 30 is connected at the input end to the inputs 25a, 26a (input 26a corresponds to the terminal 21) for inputting the clock signals CLK and CLKa. At the output end, the AND gate 30 is connected to an input of the first NOR gate 31 which is connected downstream. The NOR gate 31 is connected at the output end both to the output 24a of the logic gate device 23a and to a first input of the second NOR gate 32 via a feedback. The second input of the second NOR gate 31 is connected to the input 27a (input 27a corresponds to the terminal 18), in order to input the control signal S2a. At the output end, the second NOR gate 32 is connected to the second input of the first NOR gate 31.

Figure 3B:
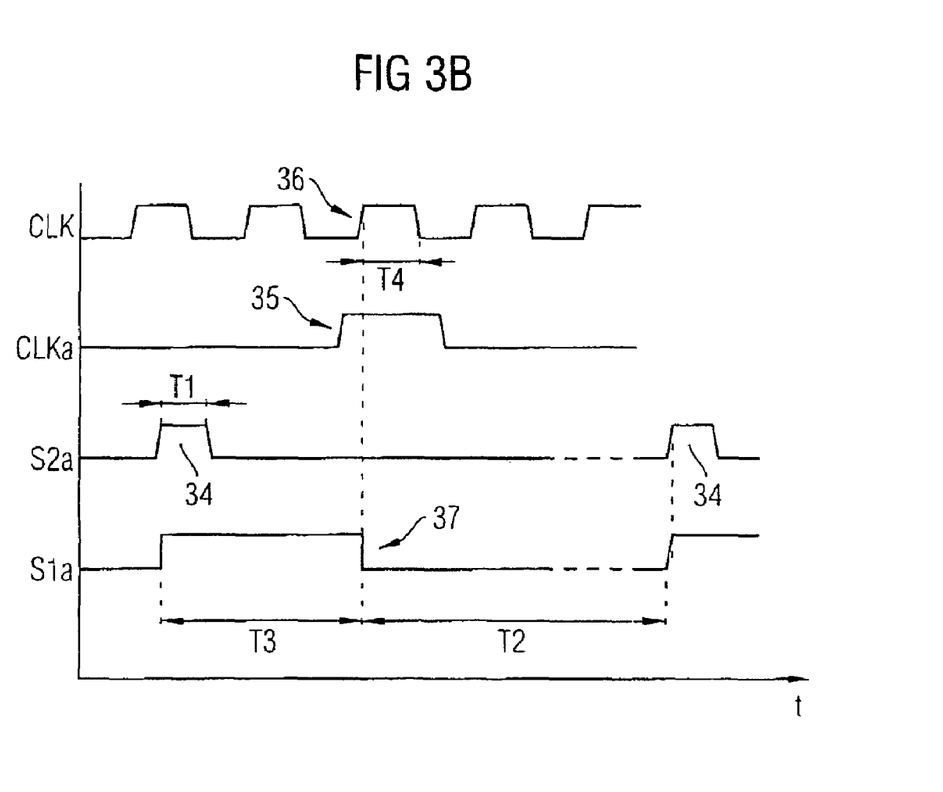

The method of functioning of the logic gate device 23a will be explained briefly below with reference to the signal time profiles in FIG. 3b:

The common clock signal CLK can be generated, for example, from an external clock supply source. The common clock signal CLK is formed, for example, from the system clock or the master clock of the A/D converter. The clock signals CLKa with interleaved timing are generated therefrom by means of the window device 22. This window device 22 can be formed in the simplest case as a DLL circuit 22. It would also be conceivable here to have a conventional delay circuit which generates the different time-interleaved clock signals 25a-25d each with different delays. According to the invention, a new status signal S2a is then provided which indicates whether the A/D conversion of the respective individual A/D converter 15a is concluded. If the A/D conversion is concluded, the respective individual A/D converter then transmits, as a status signal S2a, a short voltage pulse 34 with the duration T1 and thus places the RS flip-flop, composed of the NOR gates 31, 32, in a state which permits renewed sampling of the analog input signal Va_in. The switch-on signal S1a is set to a high logic level ("1", high) for the period T3. In this state, the track-and-hold circuit is switched on, that is to say in the tracking operating mode in which the analog input signal Va_in is read into the respective track-and-hold circuit.

In the high state of the time-interleaved clock signal CLKa, the current sampling time is then defined. This current sampling time is formed by the positive edge 36 of the clock signal CLK if the time-interleaved clock signal CLKa has formed a high logic level.

As a result of this, the switch-on signal S1a experiences a signal change 37 at the same time as the chronologically following rising clock edge 36 of the common clock signal CLK and is set to the low logic level ("0", low). In this state, the track-and-hold circuit is switched off, that is to say is in the hold operating mode. In the hold mode, the analog input signal which has just been read into the track-and-hold circuit is sampled, suitably amplified and passed on to the following individual A/D converter. The track-and-hold circuit remains in the switched-off state for the period T2, for as long as the switch-on signal S1a has a low logic level.

The switch-on signal S1a changes again to a high logic level provided that the next pulse 34 of the status signal S2a from the respective individual A/D converter 15a appears. As a result, the track-and-hold circuit and thus the corresponding individual A/D converter 15a remain activated for the period T2 during which the switch-on signal S1a has a low logic level. In the exemplary embodiment in FIG. 3a, 3b, the time period T2 in which the track-and-hold circuit 14a and thus the individual A/D converter 15a are activated is at a maximum.

Figure 4A:
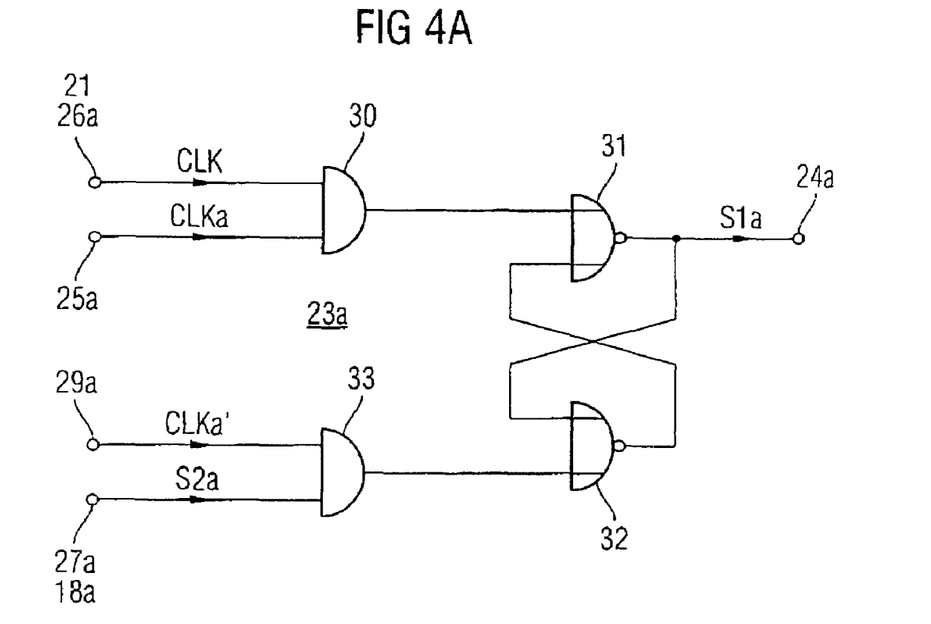
Figure 4B:
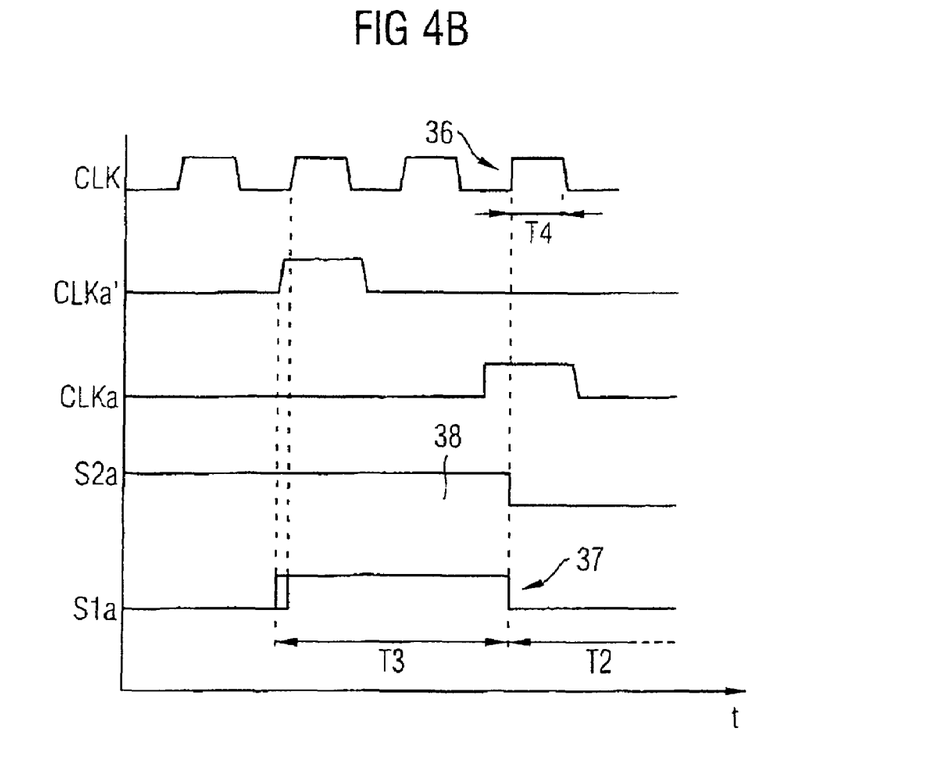
Figure 4C:
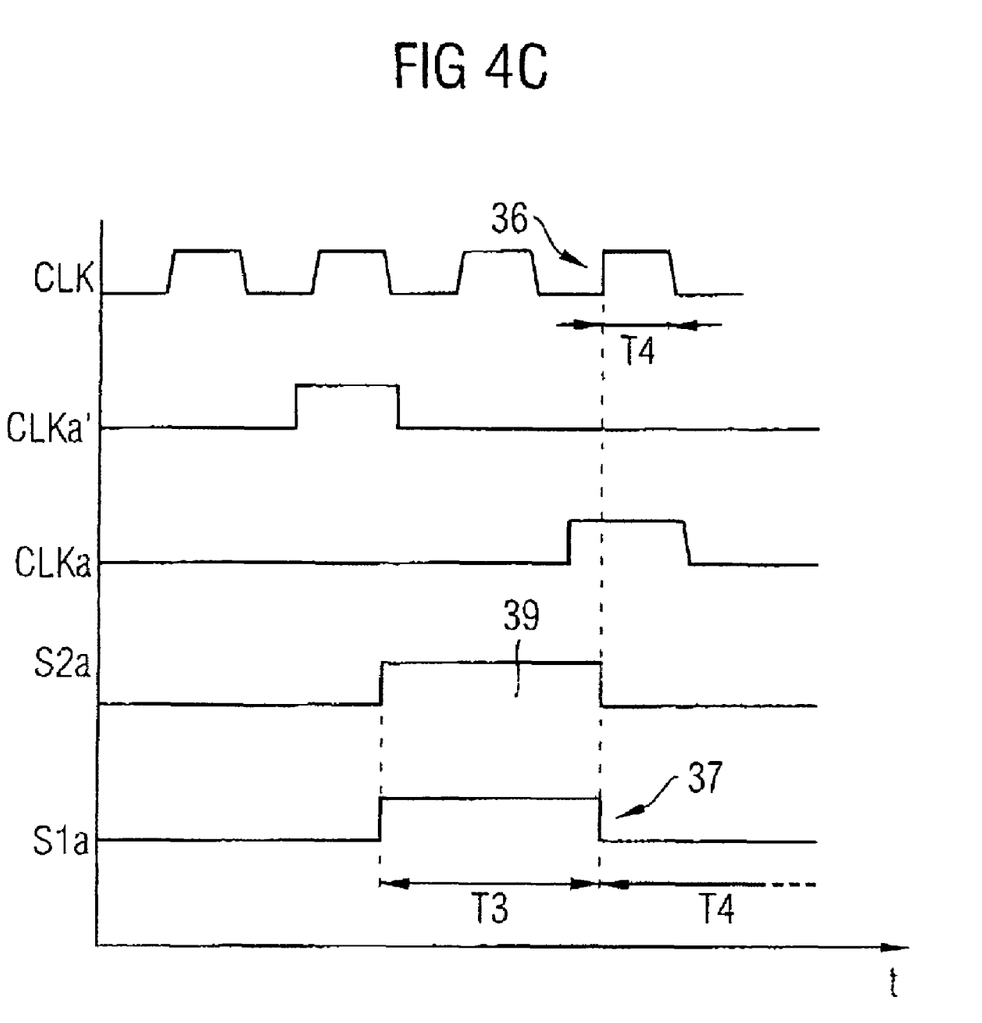

FIG. 4 shows a circuit diagram of a second, likewise preferred exemplary embodiment of a logic gate device for a clock generator (a) and two associated signal/time profiles of the signals (b), (c).

The logic gate device 23a in FIG. 4 constitutes a development of the gate device from FIG. 3. In contrast to the exemplary embodiment in FIG. 3, the gate device 23a here has a second AND gate 33 which is connected upstream of the second NOR gate 32 and is thus arranged between the second input of this NOR gate 32 and the input 27a. The status signal S2a is fed, on the one hand, to the second AND gate 33. A further time-interleaved clock signal CLKa' is input into a second input 29a of the AND gate 33. An AND logic operation is performed on these two signals CLKa', S2a and the resulting output signal is fed to the second input of the NOR gate 32 which is arranged downstream.

The method of functioning of this development of the logic gate device 23 will be described briefly below with reference to the signal time profiles in FIGS. 4b and 4c.

Here, in addition to the status signal CLKa, a further control signal CLKa' is introduced. This control signal CLKa' has the same timing and the same meaning as the delayed clock signal CLKa, with the difference that it occurs earlier, for example two or more clock cycles before the time-interleaved clock signal CLKa. The use of this status signal or control signal CLKa' is used in particular for such individual A/D converters which run more or less irregularly. In such individual A/D converters it is advantageous if the time window within which the respective track-and-hold circuit is switched on, and thus activated, is not too large. In this respect, this additional control signal CLKa' provides a possible way of setting which limits the duration of this time window. In very fast individual A/D converters this configuration is, on the other hand, typically not necessary, or at least not absolutely necessary.

On condition that the status signal S2a has a high logic level 38 ("high") when the conversion is switched off, FIG. 4c shows this at a fixed, that is to say defined sampling time before the sampling point. Assuming that the status signal S2a is active provided that the respective individual A/D converter is not carrying out a conversion, a circuit is obtained which attempts to activate the respective track-and-hold circuit for a predetermined time period if the individual A/D converter is ready again to activate this signal. FIG. 4c shows a state in which this condition does not apply, so that the track-and-hold circuit is activated (switched on) once the converter is ready again to carry out a conversion, in which state the status signal S2a therefore has a high logic level 39.

The signal/time diagrams in FIGS. 4b and 4c each show the case in which the switch-on signal S1a which switches off the track-and-hold circuit, and thus starts the conversion, is set (at the edge 37) from the high logic level (high) to a low logic level (low), and thus resets the status signal S2a.

In a further embodiment, not illustrated in FIG. 4, the second AND gate 33 could have an additional input which is connected to the terminal 26a and into which, as it were, the common clock signal CLK is thus input. As a result, a highly precise time window is defined for the track-and-hold circuit.

Although the present invention has been described above with reference to preferred exemplary embodiments, it is not restricted thereto but rather can be modified in any desired way without departing from the idea of the invention.

The invention is thus not restricted to the specific examples of circuitry, and in particular not to the specific use of the NOR gates or AND gates. In particular, their embodiment can be varied as desired by, for example, using the De Morgan relationships without departing from the corresponding method of functioning and thus from the idea of the invention.

Although the exemplary embodiment described in FIG. 2 is formed with four converter paths, that is to say n=4, and in a corresponding way an identical number, that is to say n=4, of track-and-hold circuits and individual A/D converters are provided, the invention will not be restricted to just this number but instead it is of course also possible to provide fewer than four, for example two or three, or more than four converter paths, track-and-hold circuits and individual A/D converters.

Of course, the entire circuit arrangement can also be provided in an inverted form, in which case the corresponding clock signals, status signals and control signals would then have to be modified in a corresponding way. Instead of setting the switch-on time to a positive edge and the switch-off time to a negative edge of a corresponding signal, an inverted logic would also be conceivable.

In addition it would be conceivable not to use the external common clock signal as a reference but rather to generate its function by means of another clock signal or control signal which is generated internally by the A/D converter.

I claim as my invention:

1. A circuit arrangement for generating switch-on signals for driving track-and-hold elements of an analog-to-digital converter operating with interleaved timing, said circuit arrangement comprising:
   a first input for inputting a common reference clock signal,
   at least one window device for generating clock signals which are interleaved with respect to one another in terms of timing and whose respective time windows in which the respective of said clock signals has a first logic level are derived from said reference clock signal,
   at least one gate device for generating a switch-on signal; said gate device being connected downstream of said window device and logically combining said reference clock signal with a respective of said clock signals and with a further information item so that a time window of said switch-on signal is at least longer than said window of said reference clock signal.

2. The circuit arrangement of claim 1, wherein said additional information item is a status information item about an instantaneous status of a conversion of an individual A/D converter assigned to a corresponding of said track-and-hold elements.

3. The circuit arrangement of claim 2, comprising at least one second input, into which a status signal comprising said status information about said status of a current A/D conversion of an respective of said individual A/D converters is input.

4. The circuit arrangement of claim 1, being embodied as a clock generator which comprises, as said first input, a clock input for inputting said common reference clock signal; said clock generator comprising a plurality of outputs at which said switch-on signals are present.

5. The circuit arrangement of claim 1, wherein said window device comprises a DLL circuit.

6. The circuit arrangement of claim 1, wherein the number of said gate devices corresponds to at least one of the number of said clock signals generated by said window device or the number of said switch-on signals.

7. The circuit arrangement of claim 1, wherein at least one of said gate devices is a flip-flop.

8. The circuit arrangement of claim 7, wherein said flip-flop is an RS flip-flop.

9. The circuit arrangement of claim 2, wherein said gate device comprises at least a first NOR-gate, which comprises a first NOR-gate output and first and second NOR-gate inputs, at least a second NOR gate, which comprises a second NOR-gate output and third and forth NOR-gate inputs, and at least a first AND-gate with a first AND-gate output; said first and second NOR-gate outputs, as well as said first and third NOR-gate inputs being connected to one another in crisscross fashion, said second input being connected to said second NOR-gate input, said first AND-gate output being connected to said second NOR-gate input, and inputs of said first AND-gate being connected to said window device and to said first input.

10. The circuit arrangement of claim 9, comprising a third input, into which a further clock signal is input; said further clock signal being derived from said clock signals, being synchronous with said clock signals, being interleaved with respect to said clock signals in terms of timing, and occurring before said clocks signal; said gate device generating said switch-on signals in response to said further clock signal.

11. The circuit arrangement of claim 10, comprising a second AND gate with a second AND-gate output; inputs of said AND-gate being connected to said second and third inputs and said second AND-gate output being connected to said fourth NOR-gate input.

12. The circuit arrangement of claim 1, wherein said gate device comprises a combi gate which combines the functionality of a plurality of logic gates.

13. The circuit arrangement of claim 1, wherein said window of the switch-on signal designates a time period in which an analog input signal is read into the respective of said track-and-hold elements.

14. The circuit arrangement of claim 1, wherein a time window of said reference clock signal designates the duration of a half-clock of said reference clock signal.

15. The circuit arrangement of claim 1, wherein said reference clock signal designates one of a group consisting of a master clock, the system clock of said circuit arrangement or a clock signal of one of said analog-to-digital converters.

16. An analog-to-digital converter operating with interleaved timing, comprising:
   a signal input for inputting an analog input signal;
   a signal output for presenting a digital output signal which is derived from said analog input signal by A/D conversion;
   at least two parallel converter paths arranged between said signal input and said signal output; at least one element of a respective of said converter paths being respectively driven by an assigned switch-on signal; said switch-on signals having a predetermined time interleaf with respect to one another; and
   said circuit arrangement of claim 1 for generating said switch-on signals for driving said converter paths.

17. The analog-to-digital of claim 16, wherein each of said converter paths comprises at least one individual A/D converter and a track-and-hold circuit connected upstream of said individual A/D converter; said individual track-and-hold circuit being activated by a respective of said switch-on signals in order to picks up and pass said analog input signal to said individual A/D converter connected downstream in order to generate a digital intermediate signal.

18. The analog-to-digital of claim 16, comprising a logic circuit generating said digital output signal by combining said digital intermediate signals generated by said converter paths.

19. The analog-to-digital of claim 18, wherein said logic circuit comprises at least one multiplexers.

20. The analog-to-digital of claim 17, wherein said track-and-hold circuit is an integral component of said corresponding individual A/D converter of a respective of said converter paths.

21. The analog-to-digital of claim 16, being embodied as an analog-to-digital converter operating according to the principle of successive approximation.

22. A method for operating a circuit arrangement according to claim 3, wherein said status signal is set to a first logic level for the period during which the respective conversion is active, and is otherwise set to a second logic level.

23. The method of claim 22, wherein said switch-on signal is changed, at maximum for the duration of the reading-in of said analog input signal, to said first logic level for activating said track-and-hold circuit.

24. The method of claim 23, wherein a time window in which said switch-on signal has said first logic level defines a time period during which the corresponding of said track-and-hold circuits reads in said analog input signal; said track-and-hold circuit being switched on when there is a signal change from said second logic level to said first logic level and being switched off when there is a signal change from said first logic level to said second logic level.

25. A method for operating a circuit arrangement according to claim 3, wherein said status signal briefly changes its logic level every time the conversion ends.

26. The method of claim 25, wherein said status signal has the shape of a pulse.

27. The method of claim 25, wherein said switch-on signal is changed, at maximum for the duration of the reading-in of said analog input signal, to a first logic level for activating said track-and-hold circuit.

28. The method of claim 27, wherein a time window in which said switch-on signal has said first logic level defines a time period during which the corresponding of said track-and-hold circuits reads in said analog input signal; said track-and-hold circuit being switched on when there is a signal change from a second logic level to said first logic level and being switched off when there is a signal change from said first logic level to said second logic level.

* * * * *